(12) United States Patent
Hiroshima

(10) Patent No.: US 7,148,095 B2
(45) Date of Patent: Dec. 12, 2006

(54) SEMICONDUCTOR DEVICE, ELECTRO-OPTIC DEVICE, INTEGRATED CIRCUIT, AND ELECTRONIC APPARATUS

(75) Inventor: Yasushi Hiroshima, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/095,553

(22) Filed: Apr. 1, 2005

(65) Prior Publication Data
US 2005/0233594 A1    Oct. 20, 2005

(30) Foreign Application Priority Data
Apr. 1, 2004    (JP) .............................. 2004-109099

(51) Int. Cl.
*H01L 21/00*    (2006.01)
*H01L 21/20*    (2006.01)
(52) U.S. Cl. ..................... 438/166; 438/486; 438/487
(58) Field of Classification Search ................. 257/57, 257/64, 66, 75; 438/166, 479, 486, 487
See application file for complete search history.

(56) References Cited

U.S. PATENT DOCUMENTS

2003/0034523 A1* 2/2003 Hiroshima .................. 257/347
2003/0183875 A1* 10/2003 Isobe et al. ................. 257/347
2003/0197222 A1* 10/2003 Hara et al. .................. 257/347
2003/0218171 A1* 11/2003 Isobe et al. ................... 257/64

FOREIGN PATENT DOCUMENTS

JP    11-087243 A    3/1999

OTHER PUBLICATIONS

"Single Crystal Thin Film Transistors," IBM Tech. Bull., Aug. 1993, pp. 257-258.
R. Ishihara et al., "Advanced Excimer-Laser Crystallization Techniques of Si thin-Film for Location Control of Large Grain on Glass," Proc. SPIE vol. 4295 (2001), pp. 14-23.

* cited by examiner

*Primary Examiner*—Trung Dang
(74) *Attorney, Agent, or Firm*—Oliff & Berridge, PLC

(57) ABSTRACT

A method of manufacturing a semiconductor is provided. The method includes the steps of forming a priming insulation film on a substrate, forming a first insulation film on the priming insulation film, forming an opening with a diameter of $d_1$ in the first insulation film, and forming a second insulation film on the first insulation film including the opening The film thickness distribution of the second insulation film in the step of forming the second insulation film is $\pm y$ %, wherein the diameter $d_1$ of the opening satisfies the following relationship: $d_1 \leq 6500/y+85$ nm.

6 Claims, 6 Drawing Sheets

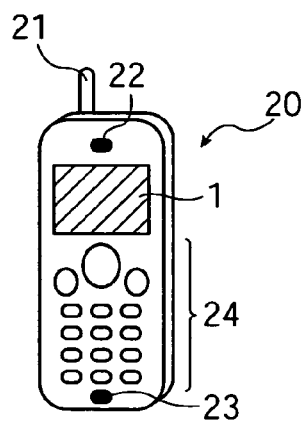
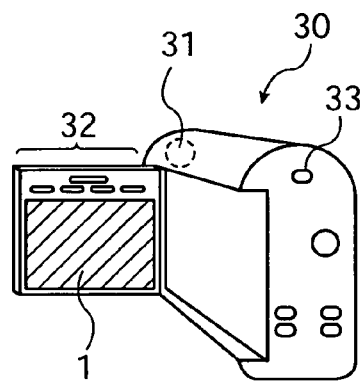
FIG. 6A FIG. 6B
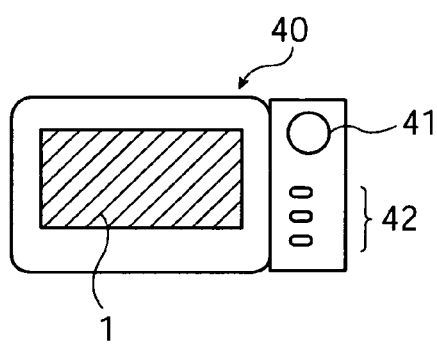
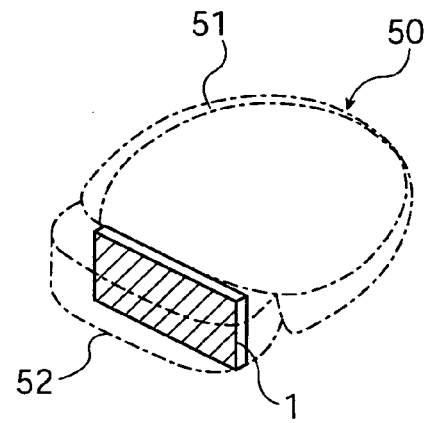
FIG. 6C FIG. 6D
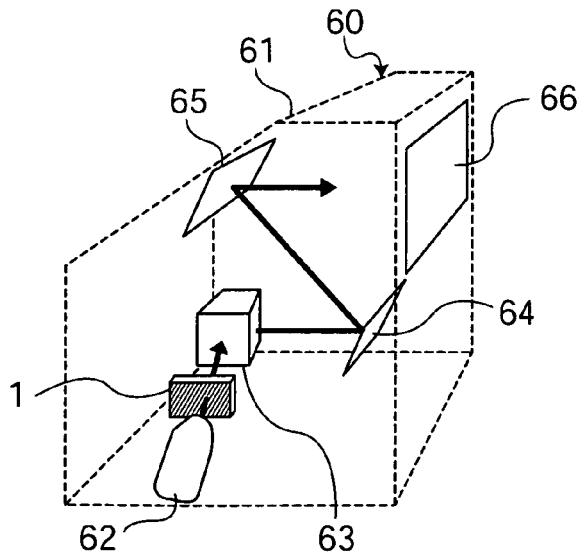
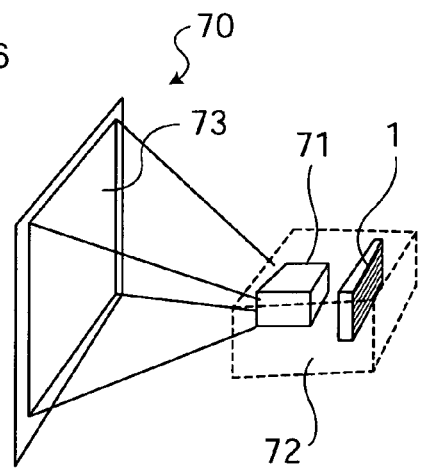
FIG. 6E FIG. 6F

SEMICONDUCTOR DEVICE, ELECTRO-OPTIC DEVICE, INTEGRATED CIRCUIT, AND ELECTRONIC APPARATUS

RELATED APPLICATION

This application claims priority to Japanese Application No. 2004-109099, filed Apr. 1, 2004, whose contents are explicitly incorporated herein by reference.

FIELD OF THE INVENTION

The present invention relates to a method of manufacturing a semiconductor device and a semiconductor device, an electro-optic device, an integrated circuit, and an electronic apparatus manufactured by the method.

BACKGROUND

In an electro-optic device such as a liquid crystal display device or an organic EL (electroluminescence) display device, pixel switching is performed using a thin film circuit composed of a thin film transistor as a semiconductor element. In conventional thin film transistors, active regions such as channel forming regions are formed with amorphous silicon films. Also, thin film transistors whose active regions are formed with polycrystalline silicon films have been in practical use. By using polycrystalline silicon films, electrical characteristics such as mobility are improved in comparison with using amorphous silicon films, thus improving performance of thin film transistors.

Further, in order to further improve performance of thin film transistors, a technology of forming a semiconductor film with large crystal grains to prevent grain boundaries from entering the channel regions of the thin film transistors is under review. For example, proposed is a technology in which a semiconductor film is crystallized using a microscopic opening, provided to a substrate, as a starting point of crystal growth to form large sized silicon crystal grains. Such a technology is described in, for example, Japanese unexamined patent publication No. 11-87243, "Single Crystal Thin Film Transistors," IBM TECHNICAL DISCLOSURE BULLETIN August 1993 pp. 257–258, and "Advanced Excimer-Laser Crystallization Techniques of Si Thin-Film For Location Control of Large Grain on Glass," R. Ishihara et al., proc. SPIE 2001, vol. 4295 pp. 14–23. By forming thin film transistors using a silicon film having large sized grains formed by the technology, the grain boundaries can be prevented from entering the single thin film transistor forming area (particularly the channel forming area). Thus, thin film transistors superior in electronic characteristics such as mobility can be realized.

SUMMARY OF THE INVENTION

The diameter of the microscopic opening can be in a range from about 20 nm to about 150 nm. If a microscopic opening of greater than 150 nm in diameter is used, the silicon grain grown from the microscopic opening includes an irregular grain boundary when, after crystallizing by laser irradiation, the amorphous silicon film is deposited on and inside the microscopic opening. Accordingly, the thin film transistor formed thereon cannot stably have the superior characteristics. Meanwhile, if a microscopic opening of less than 20 nm in diameter is used, it becomes difficult to deposit amorphous silicon inside the microscopic opening, accordingly, the silicon grain growth using laser irradiation cannot stably realized.

However, it is difficult to evenly and stably form the microscopic openings over a large sized glass substrate especially greater than 300 mm square.

Therefore, the present invention, in view of conditions of the process of forming the microscopic openings, aims to provide a method of manufacturing a semiconductor device in which the microscopic openings can be formed to stably obtain a thin film transistor of superior performance even on the large sized glass substrate.

In view of the above, an aspect of the present invention is directed to a method of manufacturing a semiconductor device for forming a thin film transistor on a substrate having at least one insulation surface using a semiconductor film. Aspects of the method include forming a priming insulation film on the substrate; forming a first insulation film on the priming insulation film; forming an opening with diameter of $d_1$ in the first insulation film; and forming a second insulation film on the first insulation film including the hollow section, wherein if the film thickness distribution of the second insulation film within the surface of the substrate in the step of forming the second insulation film is $\pm y$ %, the diameter $d_1$ of the opening satisfies the following relationship:

$$d_1 \leq 6500/y + 85 \text{ nm}$$

Although it is known that crystal growth is started from a microscopic opening provided in the insulation film, the particular physical conditions related to, for example, the microscopic opening and so on, which need to be satisfied for stable crystal growth to obtain a semiconductor film having sufficient characteristics, have not been specified. As discovered by applicants, the hollow section (microscopic opening) capable of achieving stable crystal growth can be formed when the diameter of the opening provided to the first insulation film and the film thickness distribution of the second insulation film within the surface of the substrate have the above relationship.

Further, the diameter $d_1$ of the opening preferably satisfies the following relationship:

$$d_1 \leq 897.5 \text{ nm}.$$

It has been discovered by the applicants that the substantially single crystal grain can stably be grown if such a numerical condition is satisfied.

In the step of forming the second insulation film, assuming that the proportional relationship between the thickness of the second insulation film deposited on the side wall of the opening and the thickness of the second insulation film deposited on the first insulation film is x, the diameter $d_1$ of the opening preferably satisfies the following relationship:

$$d_1 \leq 1500x + 85 \text{ nm}.$$

It has been discovered by the applicants that the substantially single crystal grain can stably be grown if such a numerical condition is satisfied.

Further, the diameter $d_1$ of the opening preferably satisfies the following relationship:

$$d_1 \leq 835 \text{ nm}.$$

It has been discovered by the applicants that the substantially single crystal grain can stably be grown if such a numerical condition is satisfied.

In a semiconductor device composed of a thin film transistor formed of a semiconductor film formed on a substrate having at least one insulation surface, the semiconductor film can include a substantially single crystal grain provided on the substrate as an origin formed using a starting point section, where the starting point section can be a hollow section provided to the substrate. The hollow section can be obtained by depositing the second insulation film in an opening provided to the first insulation film and having a diameter no greater than 897.5 nm. It has been discovered by the applicants that the substantially single crystal grain can stably be grown if such a numerical condition is satisfied.

The hollow section can be obtained by depositing the second insulation film in an opening provided to the first insulation film and having a diameter no greater than 835 nm. It has been discovered by the applicants that the substantially single crystal grain can stably be grown if such a numerical condition is satisfied.

BRIEF DESCRIPTION OF THE DRAWINGS

FIGS. 6A through 6F are schematic views showing examples of electronic equipment capable of applying a display device according to aspects of the present invention.

DETAILED DESCRIPTION OF THE INVENTION

Hereinafter, an illustrative embodiment for putting the present invention into practice is described with reference to the accompanying drawings.

First Embodiment

The manufacturing method according to the present illustrative embodiment includes (1) the step of forming microscopic openings on a substrate, the microscopic openings being hollow sections which become starting points of crystallization of silicon films, that is the semiconductor films, (2) the step of growing and forming silicon grains from the microscopic openings, and (3) the step of forming a thin film transistor with the silicon films including the silicon grains. Hereinafter, each of the steps will be explained in detail.

(1) Step of Forming the Microscopic Openings

Figure 1:
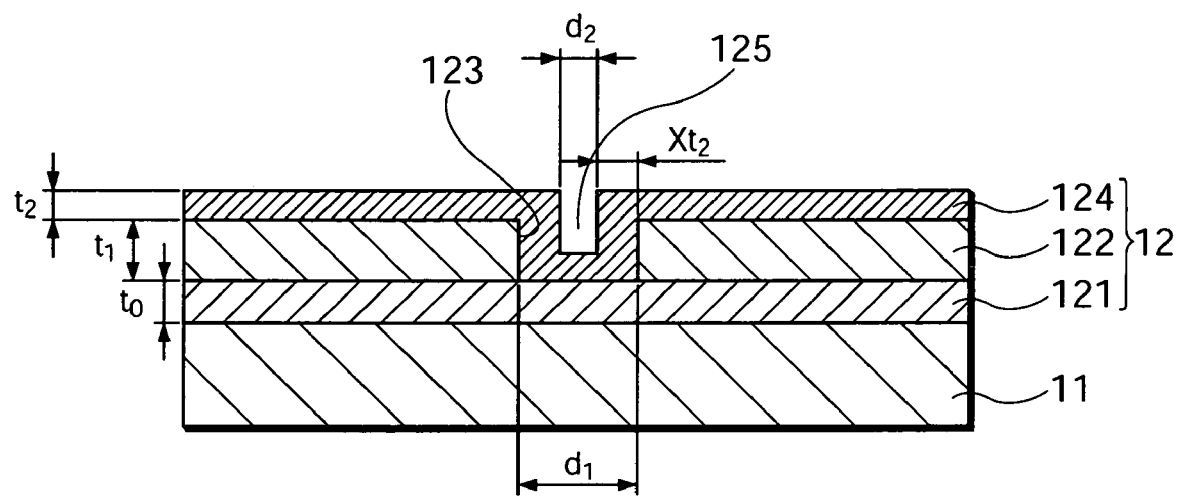
FIG. 1 is a schematic view for explaining an illustrative process of forming a microscopic opening according to aspects of the present invention.

As shown in FIG. 1, a silicon oxide film is formed on the glass substrate 11 as a priming insulation film 121. The thickness to of the priming insulation film 121 is about 200 nm, for example. Subsequently, a first insulation film 122, such as a silicon oxide film, is formed on the priming insulation film 121 with a thickness $t_1$. Next, an opening 123 to the first insulation film 122 with a diameter $d_1$ is provided. The opening 123 can be formed by executing the following steps. A photoresist film (not shown in the drawings) having openings for exposing areas where the openings 123 are to be formed is formed on the first insulation film 122 by exposing and then developing the photoresist film coated on the first insulation film 122 using a mask. Then, reactive ion etching is executed using the photoresist film as the etching mask to remove the photoresist film. Subsequently, a second insulation film 124, such a silicon oxide film, is formed on the first insulation film 122 including the openings 123. The average thickness of the second insulation film 124 is $t_2$ with film thickness distribution of ±y %. Further, when the second insulation film 124 is deposited, the proportional relationship of the thickness of the film deposited on the side surface of the opening 123 to the average thickness $t_2$ of the film deposited on the first insulation film 122 is assumed to be x.

Either of the priming insulation film 121, the first insulation film 122, or the second insulation film 124 can be formed by a PECVD process using, for example, TEOS (Tetra Ethyl Ortho Silicate) or silane (SiH4) gas. Applying a PECVD process, the value of x is generally less than or equal to 1.

Microscopic openings 125, having a diameter $d_2$ smaller than the diameter $d_1$ of opening 123, can be formed as the hollow sections by depositing the second insulation film 124 in the openings 123 provided to the first insulation film 122. The diameter $d_2$ is represented by the following equation:

$$d_2 = d_1 - 2*xt_2.$$

In a practical sense, considering the film thickness distribution, the diameter $d_2$ varies, in accordance with the surface of the substrate 11, in a range between $d_1-2*(1+y/100)*xt_2$ and $d_1-2*(1-y/100)*xt_2$.

In the step of growing the silicon grains from the microscopic openings 125 as described below, the diameter $d_2$ of the microscopic openings 125 can be within a range between 20 nm and 150 nm. By forming the microscopic openings 125 to satisfy the following conditions described below, the silicon grains can stably be grown from the microscopic openings 125.

Condition 1: $d_1-2*(1+y/100)*xt_2 \geq 20$ nm; and
Condition 2: $d_1-2*(1-y/100)*xt_2 \leq 150$ nm.

Consequently, by simultaneously solving the equations above representing Conditions 1 and 2 using the following conditions as the broadest allowable pair of conditions, a third condition (Condition 3) is obtained as follows.

Condition 1=20 nm;
Condition 2=150 μm; and
Condition 3: $xt_2 = 3250/y$ nm.

If the diameter $d_2$ of the microscopic openings 125 is assumed to be equal to 85 un (the center value of 20 nm and 150 nm), to determine a suitable value for the diameter $d_1$ of the openings 123 provided to the first insulation layer 122, a fourth condition (Condition 4) is obtained as follows.

Condition 4: $d_1 = 2*xt_2 + d_2 = d_2*3250/y + 85$ nm $= 6500/y + 85$ nm.

Accordingly, by forming the diameter $d_1$ to satisfy a fifth condition (Condition 5), stable formation of the silicon grains described below can be realized.

Condition 5: $d_1 \leq 6500/y + 85$ nm.

In particular, in the formation of insulation films using a typical PECVD process, since the deposition can be performed with the film thickness uniformity y of about 8%, stable formation of the silicon grains can be realized by designing and forming the openings with the diameter $d_1$ being less than or equal to 897.5 nm in accordance with Condition 5.

In another aspect, if the thickness of the silicon oxide film deposited on the glass substrate is equal to or greater than about 1.5 μm, cracks or abruptions can be caused by the internal stress of the silicon oxide film. Therefore, it is desirable that the total thickness of the films deposited in the process of forming the microscopic openings satisfies the following:

$t_0+t_1+t_2 \leq 500$ nm.

If the glass substrate 11 is used, the thickness to of the priming insulation film 121 needs to be greater than about 100 nm, desirably greater than about 200 nm to avoid contamination with impurities from the glass substrate 11. Further, applicants have discovered that the thickness $t_1$ of the first insulation film 122, which relates to the depth of the microscopic openings 125 to be formed after depositing the second insulation film 124, is desirably greater than about 550 nm. Accordingly, the following is obtained:

$t_2 \leq 750$ nm.

By applying the above into the Condition 4, the following is obtained:

Condition 6: $d_1 \leq 1500x+85$ mm.

Therefore, in a process for forming liquid crystal grains described below, more stable formulation of the silicon grains can be realized by forming the openings 123 with the diameter $d_1$ to satisfy Conditions 5 and 6.

Since, in general, x takes a value from 0.5 to 1, applying Condition 6, diameter $d_1$ of the openings 123 falls within a range from 835 to 1585 nm. In the actual formulation of the silicon oxide film by the PECVD process, since x takes a value of about 0.5 through 0.6, the diameter $d_1$ is formed to be within the range of 835 through 985 nm. Further, in order to reduce the influence that the variance in x has on the manufacturing process, it is that the diameter $d_1$ satisfy the following:

$d_1 \leq 835$ nm.

(2) Crystal Grain Forming Process

FIGS. 2A through 2D are cross-sectional views for explaining the process for forming a silicon film 13.

Figure 2A:
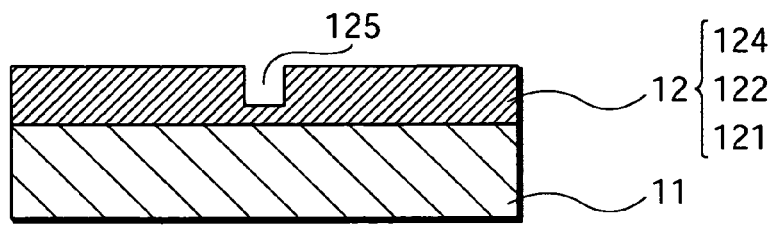
FIGS. 2A through 2D are schematic views for explaining an illustrative process of forming a silicon film according to aspects of the present invention.

FIG. 2A shows the microscopic opening 125 formed by the process described above. Hereinafter, an insulation film 12 is introduced as a generic term for the priming insulation film 121, the first insulation film 122, and the second insulation film 124.

Figure 2B:
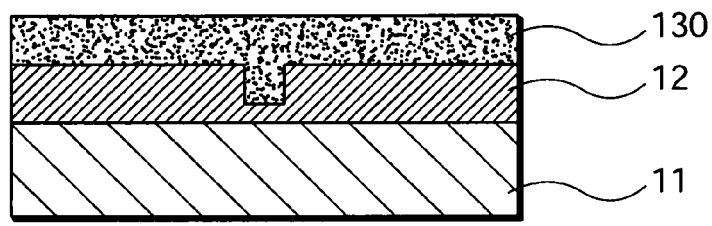

As shown in FIG. 2B, an amorphous silicon film 130 to be used for a semiconductor film is formed on the second insulation film 124, and inside the microscopic openings 125 using a film forming process such as a LPCVD process or a PECVD process. The amorphous silicon film 130 is preferably formed to have the thickness in a range from about 50 to 300 nm. Further, a polycrystalline silicon film can be formed instead of the amorphous silicon film 130. Note that, if the silicon films 13 are formed by the LPCVD process or the PECVD process, the content of hydrogen in the obtained silicon films 13 can be relatively large. In these cases, to prevent ablation of the silicon film from occurring during laser irradiation described below, heat treatment is preferably executed for reducing the content of hydrogen (preferably no greater than 1%) in the silicon film 13.

Figure 2C:
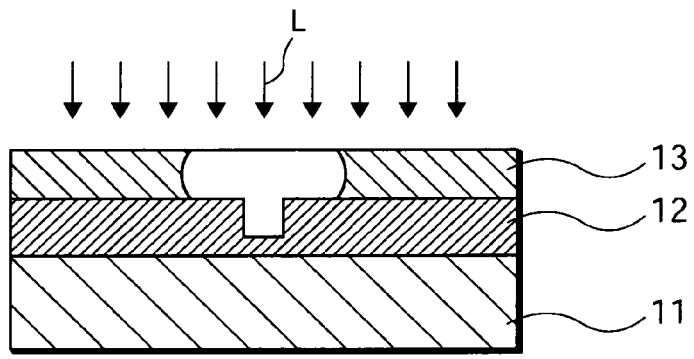

Subsequently, as shown in FIG. 2C, the laser irradiation L is executed on the silicon film 13. The laser irradiation L can be executed using, for example, a XeCl pulse excimer laser having a wave length of 308 nm and a pulse width of 20 through 30 ns or a XeCl excimer laser having pulse width of 200 ns with an energy density of about 0.4 through 2.0 J/cm2. By irradiating with the laser under such conditions, most of the irradiated laser is absorbed in the vicinity of the surface of the silicon film 13. This is because the absorption coefficient of the amorphous silicon in the wavelength (308 nm) of the XeCl pulse excimer laser is relatively large, e.g., 0.139 nm$^{-1}$.

By properly selecting the conditions of laser irradiation, the silicon film 13 is placed in a condition in which one part remains unmelted at the bottom of the microscopic openings 125, and another part is almost completely melted. Thus, after the laser irradiation the silicon crystal growth begins earlier near the bottom of the microscopic openings 125 and propagates to the vicinity of the surface of the silicon film 13, namely the almost completely melted part. Even if the energy density of the laser irradiation is slightly stronger and no unmelted part remains at the bottom of the microscopic openings 125, there is created a temperature variation between the vicinity of the surface of the silicon film 13 which is in the almost completely melted condition and the bottom of the microscopic openings 125, which after the laser irradiation can also cause the silicon crystal growth to begin earlier near the bottom of the microscopic openings 125 and similarly propagate to the vicinity of the surface of the silicon film 13, namely the almost completely melted part.

Figure 2D:
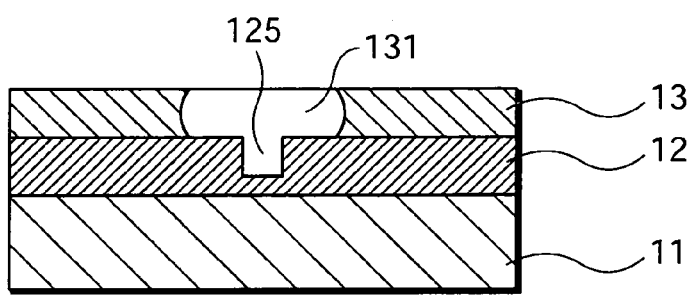

In an early stage of the silicon crystal growth, some crystal grains can be generated at the bottom of the microscopic openings 125. In this case, if the cross-sectional size (the diameter of the circle in the present embodiment) of the microscopic opening 125 is almost the same as or slightly smaller than that of a single crystal grain, only a single crystal grain can reach the upper section (opening section) of the microscopic opening 125. Specifically, a diameter ranging between 20 nm and 150 nm is suitable. Accordingly, in the almost completely melted part of the silicon film, the crystal growth proceeds from the core of the single crystal grain reaching the upper part of the microscopic opening 125, and as shown in FIG. 2D, forms a silicon film formed of silicon grains 131 arranged regularly and having large grain size, each having the microscopic opening as the substantial center thereof. The silicon grains can include regular grain boundaries (coincidence grain boundaries) such as $\epsilon=3$, $\epsilon=9$, or $\epsilon=27$, but are substantially single crystal grains excluding irregular grain boundaries. In general, irregular grain boundaries including a lot of silicon unpaired electrons can cause degradation or variation of the characteristics of a thin film transistor formed thereon. Since the silicon grains 131 formed by the present method do not include irregular grain boundaries, a thin film transistor having superior characteristics can be obtained by forming the thin film transistor within the crystal grain. However, in this case, if the microscopic opening 125 has a diameter greater than about 150 nm, a number of crystal grains generated at the bottom of the microscopic opening 125 grow to reach the upper portion of the microscopic opening. As a result, irregular grain boundaries may be included in the silicon grain formed from the substantial core of the microscopic opening 125.

The glass substrate 11 can be heated during the crystallization by laser irradiation described above. For example, a heating process can be executed with a stage for mounting the glass substrate 11 so that the temperature of the glass substrate 11 is kept in a range from about 200° C. to about 400° C. As described above, the grain size of each of the silicon grains 131 can further be enlarged by using the heating process in combination with laser irradiation. When the heating process is used in combination with laser irradiation, the grain size of the silicon grains 131 can be nearly one and a half times larger than the grain size obtained when laser irradiation is performed without the heating process. Further, since the crystallization proceeds more slowly when the heating process is employed, the crystallinity of the silicon grains 131 is advantageously improved.

(3) Thin Film Transistor Forming Process

Hereinafter, the structure of the thin film transistor formed of the silicon film described above will be explained. In the present state of the art, the grain size is about 6 μm for the silicon grain 131 obtained by crystallization taking the microscopic opening 125 as the starting point.

Figure 3:
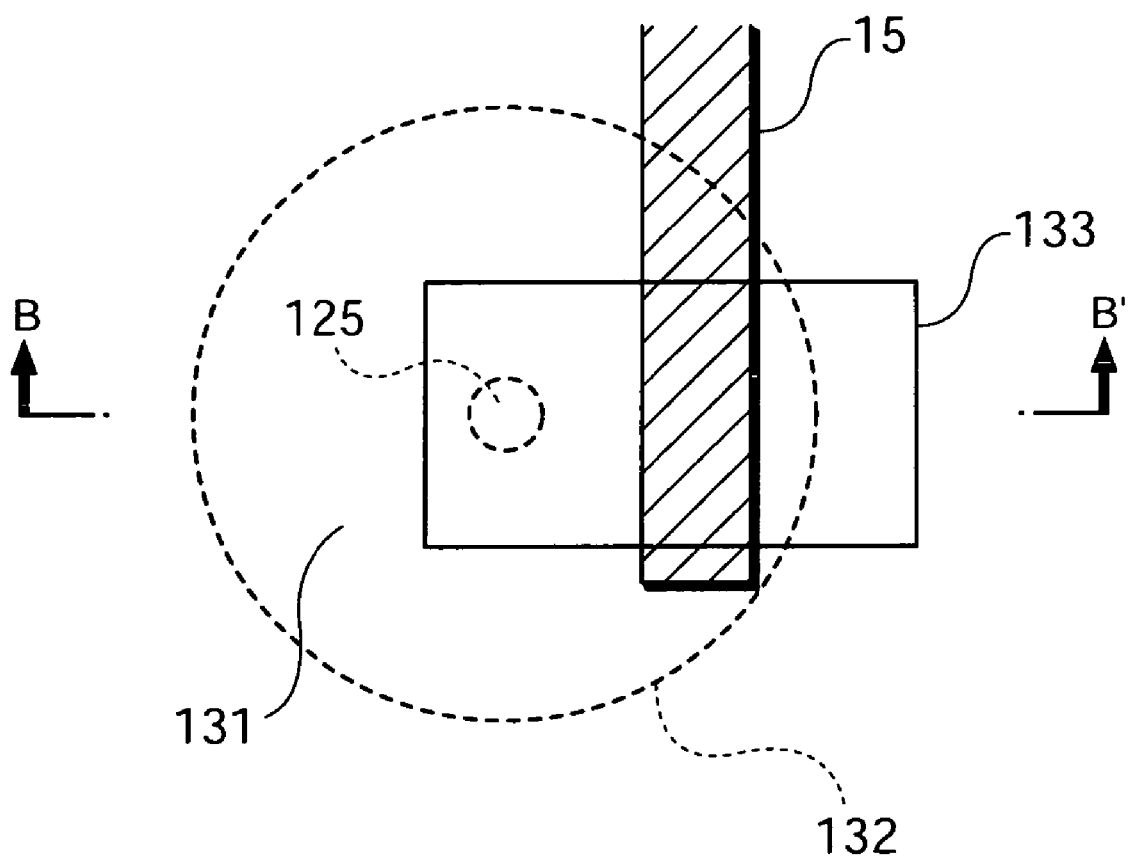
FIG. 3 is a plan view showing an illustrative thin film transistor focusing mainly on a gate electrode and activated regions (a source region, a drain region, and a channel forming region) and omitting the other structures according to aspects of the present invention.

The process for forming the thin film transistor shown in FIG. 3 is explained. FIGS. 4A through 4D assist in explaining the process for forming the thin film transistor and illustrate cross-sectional views along the B–B' direction shown in FIG. 3.

Figure 4A:
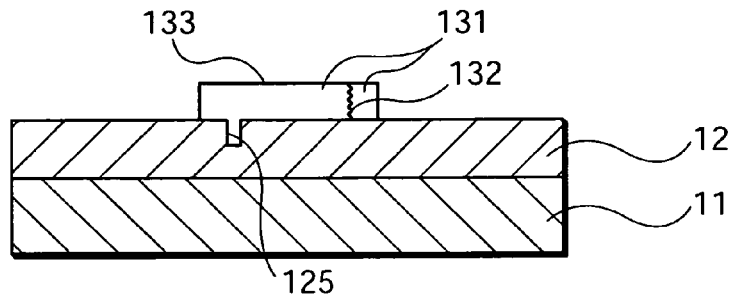
FIGS. 4A through 4D are schematic views for explaining an illustrative process of forming a thin film transistor according to aspects of the present invention.

As shown in FIG. 4A, the semiconductor film 133 is formed by patterning the silicon grain 131 and then trimming by removing the unnecessary portions for formation of the thin film transistor. In this case, a portion of the semiconductor film 133, which is to form a channel forming region 135, is arranged not to include the microscopic openings 125 in the general vicinity. This is because there are many unstable portions in and near crystallinity in the microscopic openings 125.

Figure 4B:
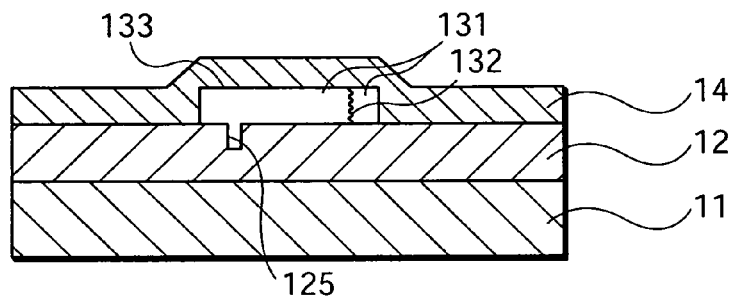

Subsequently, as shown in FIG. 4B, a silicon oxide film, gate insulation film 14, is formed on the upper surface of the second insulation film 12, and the patterned semiconductor film 133 by an electron cyclotron resonance PECVD process (ECR-PECVD process) or a parallel plate PECVD process or the like. This silicon oxide film functions as a gate insulation film 14 of the thin film transistor, and can have a thickness of about 10 nm through 150 nm.

Figure 4C:
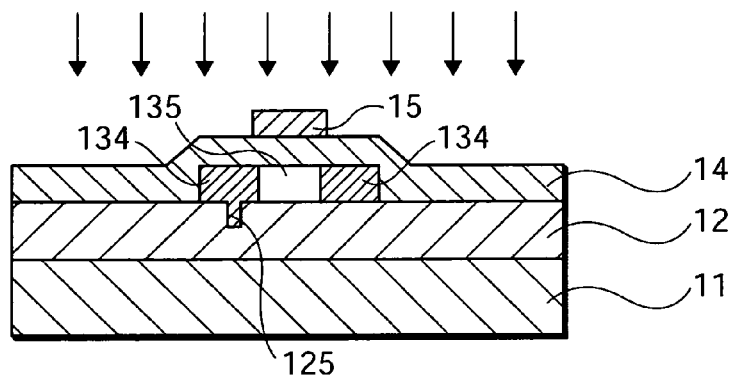

Subsequently, as shown in FIG. 4C, a gate electrode 15 and a gate wiring film are formed by patterning a metal thin film made of tantalum, aluminum, or the like using a film forming process such as a sputtering process. Next, the source region and the drain region 134 and the channel forming region 135 are formed in the silicon film by executing so-called self-aligning ion implantation in which impurity elements acting as donors or acceptors are implanted using the gate electrode 15 as a mask. For example, in the present illustrative embodiment, an N-type thin film transistor is formed by implanting phosphorous (P) as the impurity element, and then, irradiating with XeCl excimer laser adjusted to have an energy density of about 200 mJ/cm2 through 400 mJ/cm2 to activate the impurity element. Also, the impurity element can be activated by executing a heating process at a temperature of about 250° C. through 450° C. instead of the laser irradiation.

Figure 4D:
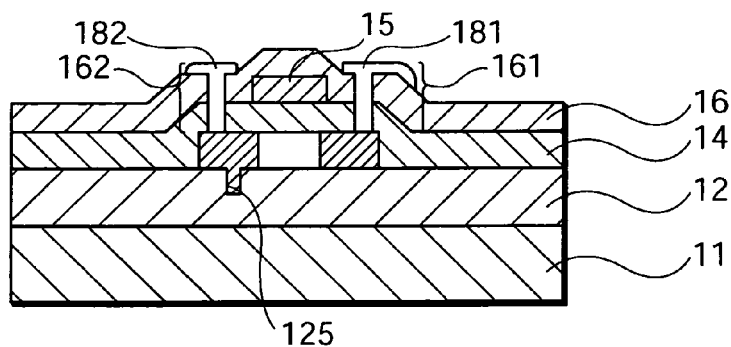

Subsequently, as shown in FIG. 4D, a silicon oxide film, interlayer insulation film 16, of about 500 nm thick is formed on the upper surface of the gate insulation film 14 and the gate electrode 15 with a film forming process such as a PECVD process. This silicon oxide film functions as an interlayer insulation film 16. Subsequently, contact holes 161, 162 are formed which respectively reaching the source region and the drain region 134 through the interlayer insulation film 16 and the gate insulation film 14, and then, the source electrode 181 and the drain electrode 182 are formed by patterning after filling contact holes 161, 162 with metal such as aluminum or tungsten using a film forming process such as a sputtering process. The thin film transistor according to the present illustrative embodiment is formed by the manufacturing process described above.

Hereinafter, an illustrative application of the thin film transistor according to the present invention is explained. The thin film transistor according to the present invention can be applied as a switching element for a liquid crystal display device or a drive element for an organic EL display device.

Figure 5:
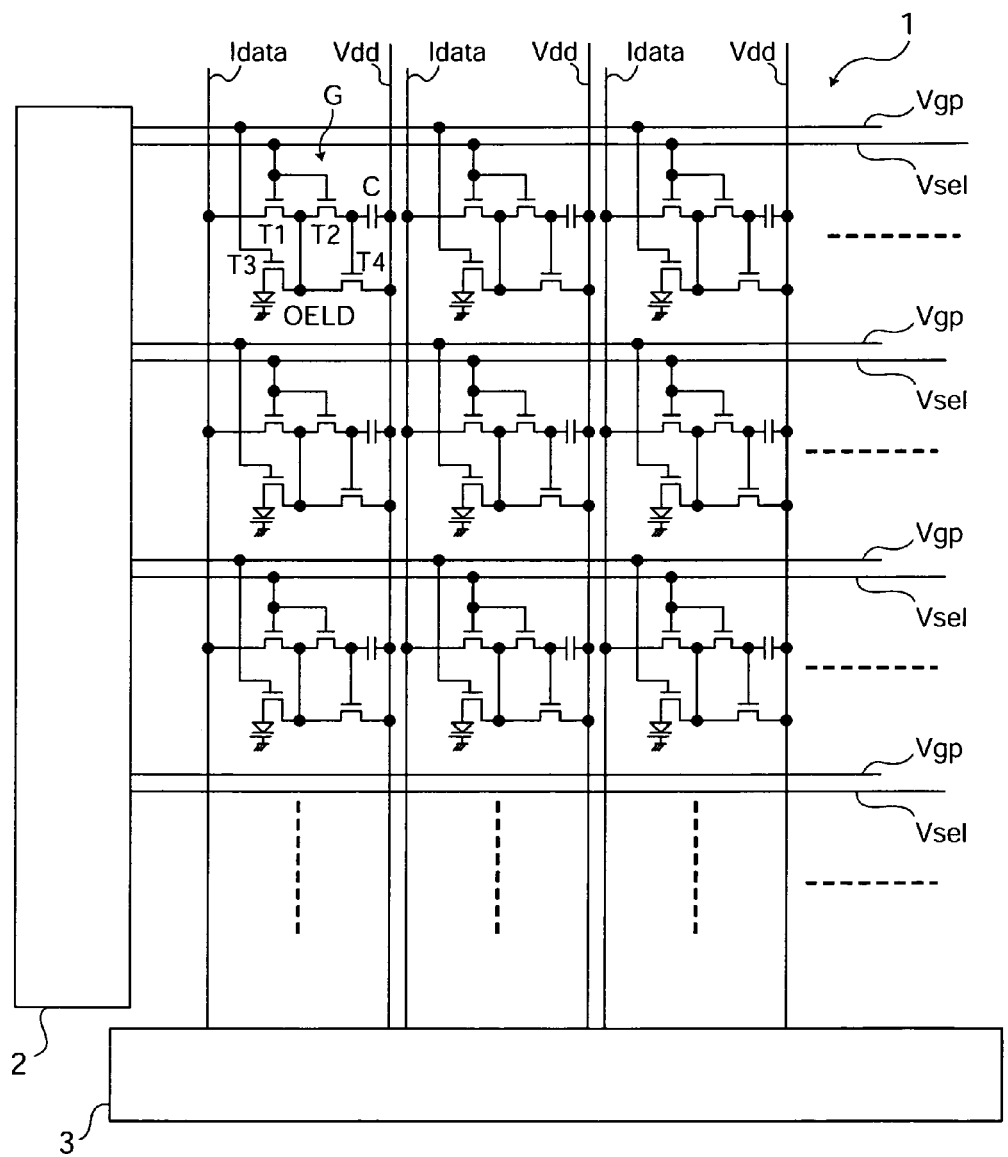
FIG. 5 is a schematic view showing an illustrative connection scheme of a display device as one example of an electro-optic device according to aspects of the present invention.

FIG. 5 is a view showing a connection scheme of a display device 1 as one example of an electro-optic device according to the present illustrative embodiment. As shown in FIG. 5, the display device 1 is configured to have pixel areas G disposed inside the display area. The pixel area G uses thin film transistors T1 through T4 for driving organic EL light emitting elements OLED. As the thin film transistors T1 through T4, those manufactured by the manufacturing process of the embodiment described above are used. A light emission control line Vgp and a write control line Vsel are coupled from a driver region 2 to each of the pixel areas G. A current line Idata and a power supply line Vdd are coupled from the driver region 3 to each of the pixel areas G. Each of the pixel areas G can be programmed by controlling the write control line Vsel and the constant current line Idata. Also, light emission from the pixel areas G can be controlled by controlling the light emission control line Vgp. Further, thin film transistors manufactured according to the present invention can be utilized in the driver regions 2 and 3. In particular, in applications requiring large current capacity such as buffer circuits for selecting the light emission control line Vgp and the write control line Vsel included in the driver region 2, it is advantageous to use such thin film transistors.

FIGS. 6A through 6F are views for showing examples of electronic equipment which can apply the display device 1. The display device 1 described above can be applied to various electronic equipments.

FIG. 6A shows an illustrative application of a cellular phone, in which a cellular phone 20 is equipped with an antenna section 21, an audio output section 22, an audio input section 23, and an operating section 24, and a display device 1 in accordance with the present invention. Thus, a display device according to the present invention can be applied as the display section.

FIG. 6B shows an illustrative application of a video camera, in which the video camera 30 is equipped with a receiver section 31, an operating section 32, and an audio input section 33, and a display device 1 in accordance with the present invention. Thus, a display device according to the present invention can be applied as a viewfinder or the display section.

FIG. 6C shows an illustrative application example of a mobile personal computer (so-called PDA), in which the computer 40 is equipped with a camera section 41, and an operating section 42, and a display device 1 in accordance with the present invention. Thus, a display device according to the present invention can be applied as the display section.

FIG. 6D shows an illustrative example of a head mount display, in which the head mount display 50 is equipped with a band 51, and an optical system housing section 52, and a display device 1 in accordance with the present invention. Thus, a display panel according to the present invention can be applied as an image display source.

FIG. 6E shows an illustrative application of a rear projector, in which the rear projector 60 is equipped with a light source 62, an optical system 63 for recombination, mirrors 64, 65, and a screen 66, and a display device 1 in accordance with the present invention in a chassis 61. Thus, a display device according to the present invention can be applied as an image display source.

FIG. 6F shows an illustrative application example of a front projector, in which the front projector 70 is equipped with an optical system 71 and a display device 1 in accordance with the present invention in a chassis 72 so as to be able to display images on a screen 73. Thus, a display device according to the present invention can be applied as an image display source.

The display device 1 using the transistor of the present invention can be applied not only to the examples described above but also to any electronic equipment capable of employing a liquid crystal display device or an organic EL display device of the active type or the passive type. For example, other than the above devices, the display device 1 can be utilized for a facsimile machine having a display function, a viewfinder of a digital camera, a portable TV, an electronic notepad, an electronic bulletin board, or a display for advertisement.

Also, the manufacturing method of the semiconductor device according to the embodiment described above can be combined with a component transfer technology. Specifically, after forming a semiconductor device on a first substrate which becomes a transfer origin, the semiconductor device is then transferred (moved) to a second substrate which becomes a transfer destination. Thus, regarding the first substrate, since a substrate provided with suitable conditions (a shape, a size, physical characteristics and so on) for formation of a semiconductor film or formation of an element thereafter can be used, it becomes possible to form a fine and high performance semiconductor element on the first substrate. Further, regarding the second substrate, since no restriction from the process for forming the element exists, a large sized substrate can be used, and a desired material can be used from among a wide variety of alternatives such as an inexpensive substrate made of synthetic resin or soda glass, or a plastic film having elasticity. Therefore, it becomes possible to easily (with low cost) form fine and high performance thin film semiconductor elements in a substrate with a large area.

The invention claimed is:

1. A method of manufacturing a semiconductor device, comprising:
    forming a priming insulation film on a substrate;
    forming a first insulation film on the priming insulation film;
    forming an opening in the first insulation film, the opening having a diameter $d_1$; and
    forming a second insulation film on the first insulation film including the opening,
    wherein the film thickness distribution of the second insulation film in the step of forming the second insulation film is ±y %, and the diameter $d_1$ of the opening satisfies the following relationship:

$d_1 \leq 6500/y + 85$ nm.

2. The method of manufacturing a semiconductor device according to claim 1, wherein the diameter of $d_1$ of the opening further satisfies the following relationship:

$d_1 \leq 897.5$ nm.

3. The method of manufacturing a semiconductor device according to claim 2, wherein, in the step of forming the second insulation film, the proportional relationship of the thickness of the second insulation film deposited on the side surface of the opening to the thickness of the second insulation film deposited on the first insulation film is x, and the diameter $d_1$ of the opening further satisfies the following relationship:

$d_1 \leq 1500x + 85$ nm.

4. The method of manufacturing a semiconductor device according to claim 3, wherein the diameter $d_1$ of the opening further satisfies the following relationship:

$d_1 \leq 835$ nm.

5. The method of manufacturing a semiconductor device according to claim 1, wherein, in the step of forming the second insulation film, the proportional relationship of the thickness of the second insulation film deposited on the side surface of the opening to the thickness of the second insulation film deposited on the first insulation film is x, and the diameter $d_1$ of the opening further satisfies the following relationship:

$d_1 \leq 1500x + 85$ nm.

6. The method of manufacturing a semiconductor device according to claim 5, wherein the diameter $d_1$ of the opening further satisfies the following relationship:

$d_1 \leq 835$ nm.

* * * * *